(12) United States Patent
Hayashi et al.

(10) Patent No.: US 9,192,044 B2
(45) Date of Patent: Nov. 17, 2015

(54) PRINTED WIRING BOARD, SEMICONDUCTOR PACKAGE, AND PRINTED CIRCUIT BOARD

(71) Applicant: CANON KABUSHIKI KAISHA, Tokyo (JP)

(72) Inventors: Seiji Hayashi, Yokohama (JP); Takuya Kondo, Chigasaki (JP); Shoji Matsumoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 45 days.

(21) Appl. No.: 13/862,038

(22) Filed: Apr. 12, 2013

(65) Prior Publication Data
US 2013/0279134 A1    Oct. 24, 2013

(30) Foreign Application Priority Data

Apr. 23, 2012    (JP) .................................. 2012-097572

(51) Int. Cl.
*H05K 1/16*    (2006.01)
*H05K 1/11*    (2006.01)
(Continued)

(52) U.S. Cl.
CPC ........ *H05K 1/0216* (2013.01); *H01L 23/49827* (2013.01); *H01L 23/49838* (2013.01);
(Continued)

(58) Field of Classification Search
CPC ..... H05K 1/0216; H05K 1/114; H05K 1/116; H05K 1/162; H05K 1/0298; H05K 2201/0939; H05K 2201/09418; H05K 2201/09454; H05K 2201/09463; H05K 2201/09636; H05K 2201/10378; H05K 2201/010674; H05K 1/111; H05K 1/14; H05K 1/18; H01L 23/49827; H01L 23/49838; H01L 2224/48227
USPC .................. 174/250–268; 361/760, 767, 777, 361/792–795, 818; 257/778, 780
See application file for complete search history.

(56) References Cited

U.S. PATENT DOCUMENTS 5,639,989 A * 6/1997 Higgins, III .................. 174/386
6,479,758 B1 11/2002 Arima et al.
(Continued)

FOREIGN PATENT DOCUMENTS

JP    2005-340247    12/2005
WO    2009/057856    5/2009

OTHER PUBLICATIONS

EP Search Report dated Jul. 22, 2013 in European Appl. No. 13164422.1.
(Continued)

*Primary Examiner* — Ishwarbhai B Patel
(74) *Attorney, Agent, or Firm* — Fitzpatrick, Cella, Harper & Scinto

(57) ABSTRACT

First and second signal wiring patterns are formed in a first conductor layer. A first electrode pad electrically connected to the first signal wiring pattern through a first via and a second electrode pad electrically connected to the second signal wiring pattern through a second via are formed in a second conductor layer as a surface layer. A third conductor layer is disposed between the first conductor layer and the second conductor layer with an insulator interposed between those conductor layers. A first pad electrically connected to the first via is formed in the third conductor layer. The first pad includes an opposed portion which overlaps the second electrode pad as viewed in a direction perpendicular to the surface of a printed board and which is opposed to the second electrode pad through intermediation of the insulator. This enables reduction of crosstalk noise caused between the signal wirings.

13 Claims, 11 Drawing Sheets

(51) Int. Cl.
*H05K 1/14* (2006.01)
*H05K 1/18* (2006.01)
*H05K 1/02* (2006.01)
*H01L 23/498* (2006.01)

(52) U.S. Cl.
CPC .............. *H05K1/0298* (2013.01); *H05K 1/11* (2013.01); *H05K 1/114* (2013.01); *H05K 1/116* (2013.01); *H05K 1/14* (2013.01); *H05K 1/162* (2013.01); *H05K 1/18* (2013.01); *H01L 2224/48227* (2013.01); *H05K 1/0228* (2013.01); *H05K 1/0242* (2013.01); *H05K 2201/0939* (2013.01); *H05K 2201/09418* (2013.01); *H05K 2201/09454* (2013.01); *H05K 2201/09463* (2013.01); *H05K 2201/09636* (2013.01); *H05K 2201/10378* (2013.01); *H05K 2201/10674* (2013.01); *H05K 2201/10734* (2013.01)

(56) References Cited

U.S. PATENT DOCUMENTS

| | | | |
|---|---|---|---|
| 7,102,085 B2 * | 9/2006 | Ohta et al. | 174/260 |
| 7,164,592 B2 | 1/2007 | Yoshikawa et al. | |
| 7,564,695 B2 | 7/2009 | Matsumoto | |
| 8,168,895 B2 | 5/2012 | Hayashi | |
| 8,174,843 B2 | 5/2012 | Hayashi | |
| 8,428,155 B2 | 4/2013 | Matsumoto | |
| 2005/0063166 A1 * | 3/2005 | Boggs et al. | 361/780 |
| 2007/0194433 A1 * | 8/2007 | Suwa et al. | 257/700 |
| 2007/0275607 A1 | 11/2007 | Kwark et al. | |
| 2010/0039784 A1 * | 2/2010 | Hayashi | 361/777 |
| 2012/0147580 A1 | 6/2012 | Hayashi | |

OTHER PUBLICATIONS

Chinese Office Action dated Jul. 17, 2015 for counterpart Chinese Application No. 201310142055.1.

* cited by examiner

PRINTED WIRING BOARD, SEMICONDUCTOR PACKAGE, AND PRINTED CIRCUIT BOARD

BACKGROUND OF THE INVENTION

1. Field of the Invention

The present invention relates to a printed wiring board formed by stacking multiple conductor layers through the intermediation of an insulator, a semiconductor package including the printed wiring board, and a printed circuit board including the semiconductor package.

2. Description of the Related Art

In order to realize downsizing and sophistication in functionality of electronic equipment, there is a demand for a printed wiring board having a semiconductor element mounted thereon to have densified wiring and higher circuit operation speed. Due to the demand for the densification, signal wirings of a printed wiring board tend to be closer to each other, and vias for connecting wirings in different wiring layers tend to have smaller diameters and smaller pitches.

In addition, with regard to a printed circuit board in which a semiconductor package is mounted on a motherboard (main board) under a state in which an interposer substrate (printed wiring board) of the semiconductor package and the main board are electrically and physically connected via connection terminals such as solder balls, the connection terminals have smaller pitches. As the distance between wirings becomes smaller due to the densification in this way, crosstalk noise caused by electromagnetic coupling between signal wirings increases.

Further, due to the higher circuit operation speed, the frequency of an electromagnetic field caused by signal transmission becomes higher, and also crosstalk noise caused, by a minute structure is no longer negligible. In particular, crosstalk noise caused at a via or a connection terminal which is wiring orthogonal to the surface of a printed wiring board (in a board thickness direction) is a serious problem although the structure thereof is small compared with a signal wiring pattern formed on the surface of a printed wiring board.

Accordingly, as a method of reducing crosstalk noise caused between wirings extending in the board thickness direction, there is proposed a method in which, between signal vias, an adjacent via at a ground, potential is arranged (see Japanese Patent Application Laid-open No. 2005-340247).

In the conventional structure described above, crosstalk noise caused between signal vias in a printed wiring board among wirings extending in out-of-plane directions can be reduced. However, crosstalk noise caused between connection terminals such as solder for connecting a pad on the printed wiring board and a pad on the main board among wirings extending in out-of-plane directions cannot be reduced. Therefore, such a measure is insufficient as a measure for reducing crosstalk noise between wirings extending in a direction orthogonal to the plane direction.

SUMMARY OF THE INVENTION

Accordingly, it is an object of the present invention to reduce an influence of crosstalk noise caused between wirings extending in a direction orthogonal to a plans direction along the plane of a printed wiring board.

According to an aspect of the present invention, there is provided a printed wiring board, including: a first conductor layer having a first signal wiring pattern and a second signal wiring pattern formed therein; a second conductor layer which is located on a board surface and which has a first electrode pad and a second electrode pad formed therein, the first electrode pad being electrically connected to the first signal wiring pattern through a first via, the second electrode pad being electrically connected to the second signal wiring pattern through a second via; and a third conductor layer disposed between the first conductor layer and the second conductor layer through intermediation of an insulator. The third conductor layer has a first pad formed therein, the first pad being electrically connected to the first via. The first pad includes an opposed portion which overlaps the second electrode pad as viewed in a direction perpendicular to the board surface and which is opposed to the second electrode pad through intermediation of the insulator.

According to the present invention, the first pad includes the opposed portion which is opposed to the second electrode pad, and thus, capacitive coupling between the signal wiring including the first via and the signal wiring including the second via can be increased. Thus, a noise component due to inductive coupling and a noise component due to the capacitive coupling can be cancelled, out with each other, and, as a result, crosstalk noise caused between the signal wirings can be reduced.

Further features of the present invention will become apparent from the following description of exemplary embodiments with reference to the attached drawings.

DESCRIPTION OF THE EMBODIMENTS

Exemplary embodiments of the present invention are described in detail in the following with reference to the attached drawings.

First Embodiment

Figure 1:
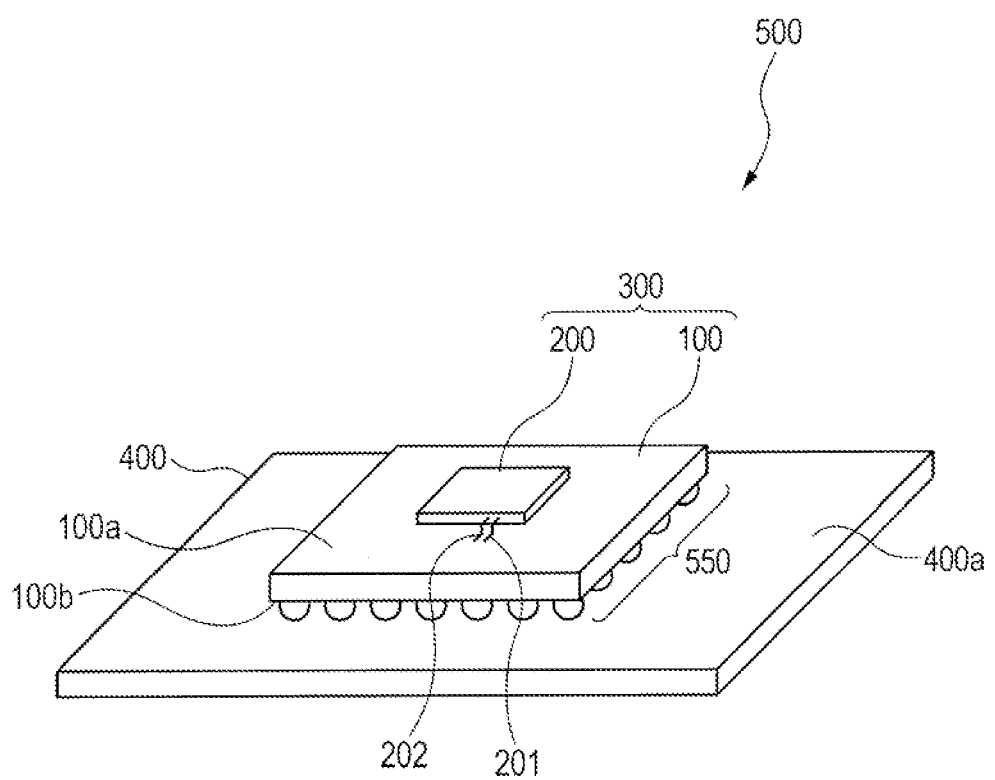
FIG. 1 is a schematic view of a printed circuit board according to a first embodiment of the present invention.

FIG. 1 is an explanatory diagram illustrating a schematic structure of a printed circuit board according to a first embodiment of the present invention. A printed circuit board 300 includes a main board 400 and a semiconductor package 300 mounted on the main board 400. The semiconductor package 300 includes a printed wiring board 100 and a semiconductor element (semiconductor chip) 200 mounted on the printed wiring board 100. The semiconductor package 300 according to the first embodiment is a ball grid array (BGA) package. The main board 400 is a printed wiring board, and the semiconductor package 300 is mounted on a surface layer thereof.

The printed wiring board 100 of the semiconductor package 300 is an interposer substrate having a pair of board surfaces 100a and 100b. The semiconductor element 200 is mounted on one board surface 100a of the printed wiring board 100. The other board surface 100b of the printed wiring board 100 and one board surface 400a of the main board 400 are bonded to each other through multiple connection terminals, which are, in the first embodiment, a solder ball group 550 formed of multiple solder balls. This enables signal transmission between signal wiring (not shown) in the printed wiring board 100 and signal wiring (not shown) in the main board 400.

The semiconductor element 200 includes multiple signal terminals. Each of the signal terminals is bonded through solder or the like to a signal wiring pattern formed on the one board surface 100a of the printed wiring board 100. In FIG. 1, a first signal terminal 201 and a second signal terminal 202 among the multiple signal terminals are illustrated. Note that, the semiconductor element 200 and the one board surface 100a of the printed wiring board 100 may be encapsulated with an encapsulating resin (not shown).

Figure 2A:
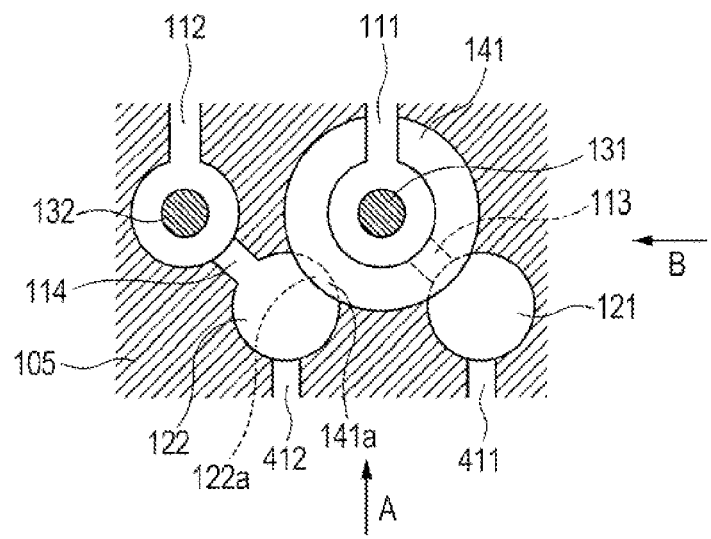
FIGS. 2A, 2B and 2C are detail views illustrating a part of the printed circuit board according to the first embodiment.
Figure 2B:
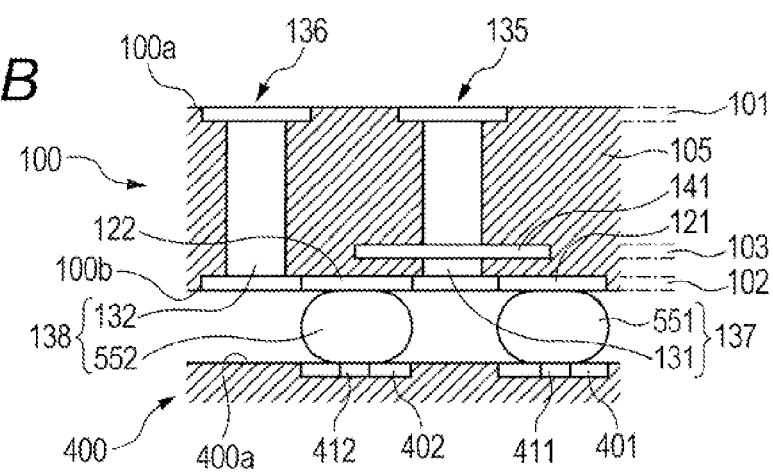
Figure 2C:
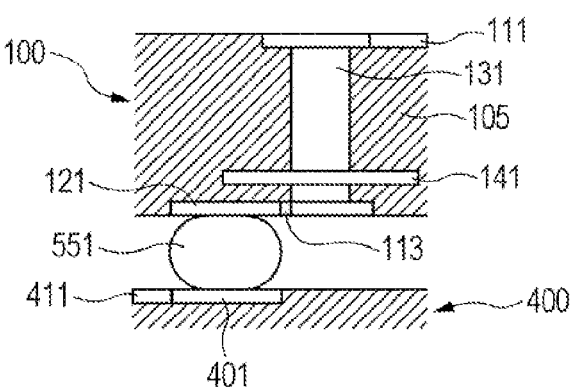

FIGS. 2A to 2C are detail views illustrating a part of the printed circuit board according to the first embodiment of the present invention. FIG. 2A is a top view of the part of the printed circuit board as viewed from above. For the sake of easy understanding, the printed wiring board 100 is transparently illustrated. FIG. 2B is a side view of the part of the printed circuit board illustrated in FIG. 2A as viewed in the direction of an arrow A. FIG. 2C is a side view of the part of the printed circuit board illustrated in FIG. 2A as viewed in the direction of an arrow B. In both FIGS. 2B and 2C, the printed wiring board 100 is transparently illustrated similarly to the case of FIG. 2A.

The first signal terminal 201 of the semiconductor element 200 is connected through a first signal wiring 135 on the printed wiring board 100 illustrated in FIG. 2B to a first main board side pad 401 to be described below on the main board 400. The second signal terminal 202 is connected through a second signal wiring 136 on the printed wiring board 100 to a second main board side pad 402 to be described below on the main board 400.

The printed wiring board 100 of the semiconductor package 300 is a multilayer printed wiring board including a first conductor layer 101, a second conductor layer 102, and a third conductor layer 103 which are spaced from one another, and an insulator (dielectric) 105 interposed between the respective conductor layers. The first conductor layer 101 is a surface layer located on the one board surface 100a, and the second conductor layer 102 is a surface layer located on the other board surface 100b. The third conductor layer 103 is an inner layer located between the first conductor layer 101 and the second conductor layer 102. Note that, in the first embodiment, there is no other conductor layer interposed between the second conductor layer 102 and the third conductor layer 103, and the second conductor layer 102 and the third conductor layer 103 are opposed to each other with the insulator 105 therebetween. The insulator 105 is a dielectric having a relative permittivity which is larger than the relative permittivity of air, and is, for example, a glass epoxy (composite material prepared by impregnating glass cloth with an epoxy resin) having a relative permittivity of 4.1 to 4.8 (median: 4.3). Note that, in these conductor layers 101 to 103, portions other than conductor patterns (except for holes) are filled with the insulator 105.

The first conductor layer 101 is a signal wiring layer having multiple signal wiring patterns formed therein. In FIG. 2A, a first signal wiring pattern 111 and a second signal wiring pattern 112 adjacent to the first signal wiring pattern 111 among the multiple signal wiring patterns are illustrated. The first signal wiring pattern 111 and the second signal wiring pattern 112 are arranged so as to be in parallel with each other in the first conductor layer 101 as the surface layer.

The first and second signal terminals 201 and 202 among the multiple signal terminals of the semiconductor element 200 are bonded to the first and second signal-wiring patterns 111 and 112, respectively, through solder or the like. This enables electrical connection of the first and second signal wiring patterns 111 and 112 to the first and second signal terminals 201 and 202, respectively.

The second conductor layer 102 is a signal wiring layer having multiple pads, which are formed of a conductor, formed therein in an array. In FIG. 2A, a first electrode pad 121 and a second electrode pad 122 adjacent to the first electrode pad 121 are illustrated. A third signal, wiring pattern 113 formed in the second conductor layer 102 is electrically connected to the first electrode pad 121, and a fourth signal wiring pattern 114 formed in the second conductor layer 102 is electrically connected to the second electrode pad 122.

The printed wiring board 100 has a first via 131 and a second via 132 formed therein which extend in a direction orthogonal to a plane direction through the printed wiring board 100 from the one board surface 100a to the other board surface 100b. One end of the first via 131 is electrically connected to the first signal wiring pattern 111 in the first conductor layer 101, while the other end of the first via 131 is electrically connected to the third signal wiring pattern 113 in the second conductor layer 102. Further, one end of the second via 132 is electrically connected to the second signal wiring pattern 112 in the first conductor layer 101, while the other end of the second via 132 is electrically connected to the fourth signal wiring pattern 114 in the second conductor layer 102. In this way, the first signal wiring pattern 111 is led through the first via 131 to the other board surface (rear surface) 100b, and after that, is connected through the third signal wiring pattern 113 to the first electrode pad 121. Further, the second signal wiring pattern 112 is led through the second via 132 to the other board surface (rear surface) 100b, and after that, is connected, through the fourth signal wiring pattern 114 to the second electrode pad 122.

Specifically, the first signal wiring 135 in the printed wiring board 100 includes the first signal wiring pattern 111, the first via 131, the third signal wiring pattern 113, and the first electrode pad 121. Further, the second signal wiring 136 in the printed wiring board 100 includes the second signal wiring pattern 112, the second via 132, the fourth signal wiring pattern 114, and the second electrode pad 122.

The one board surface 400a of the main board 400 has multiple pads (main board side pads), which are formed of a conductor, formed thereon. In FIG. 2B, among the multiple main board side pads, the first main board side pad 401 and the second main board side pad 402 adjacent to the first main board side pad 401 are illustrated. Note that, a first main board side wiring pattern 411 formed on the board surface 400a is electrically connected to the first main board side pad 401, and a second main board side wiring pattern 412 formed on the board surface 400a is electrically connected to the second main board side pad 402.

The pads on the printed wiring board 100 and the main board side pads on the main board 400 are electrically connected to each other through solder balls, respectively. In FIG. 2B, the first electrode pad 121 and the first main board side pad 401 are electrically connected through a first solder ball 551 which is a first connection terminal. Further, the second electrode pad 122 and the second main board side pad 402 are electrically connected to each other through a second solder ball 552 which is a second connection terminal. Note that, as these connection terminals, not only solder balls but also, for example rigid balls coated with solder, Cu pillars, Au pillars, or the like can be used.

In the first embodiment, the first to fourth signal wiring patterns 111 to 114 are wirings formed on the surfaces of the printed wiring board 100. Further, the first via 131 and the first solder ball 551 form a first wiring path 137 extending in the direction orthogonal to the surface of the printed wiring board 100. The second via 132 and the second solder ball 552 form a second wiring path 138 extending in the direction orthogonal to the surface of the printed wiring board 100. Further, a pad (first pad) 141 electrically connected to the first via 131 is formed in the third conductor layer 103. The pad 141 is a conductor that surrounds the via 131 and the width (diameter) thereof is larger than the wiring widths of the first to fourth signal wiring patterns 111 to 114.

The above-mentioned structure enables signal transmission under a state in which the first and second signal terminals 201 and 202 of the semiconductor element 200 of the semiconductor package 300 and the first and second main board side wiring patterns 411 and 412 on the main board 400 are electrically connected to each other, respectively.

Figure 11A:
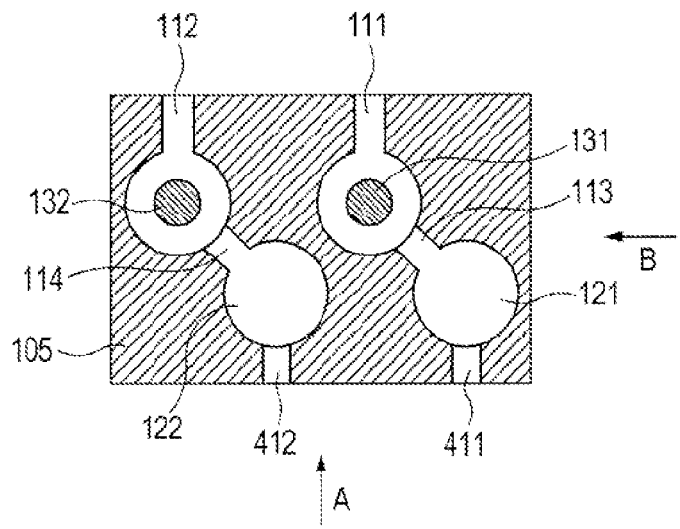
FIGS. 11A, 11B and 11C are detail views illustrating a part of a printed circuit board according to a reference example.
Figure 11B:
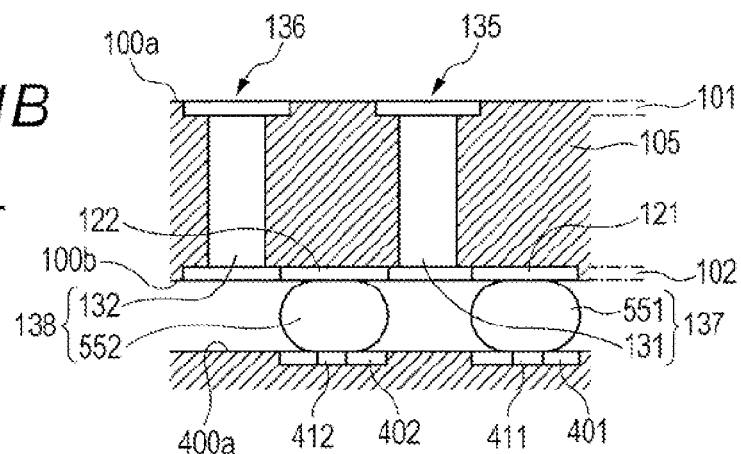
Figure 11C:
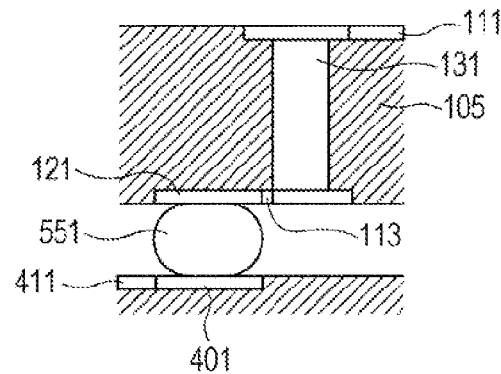

Here, for the purpose of describing the principle of the present invention, FIGS. 11A to 11C which are detail views illustrating a part of a printed circuit board according to a reference example are described. FIG. 11A is a top view of the part of the printed circuit board as viewed from above. For the sake of easy understanding, a printed wiring board is transparently illustrated. FIG. 11B is a side view of the part of the printed circuit board illustrated in FIG. 11A as viewed in a direction of an arrow A. FIG. 11C is a side view of the part of the printed circuit board illustrated in FIG. 11A as viewed in a direction an arrow B. In both FIGS. 11B and 11C, the printed wiring board is transparently illustrated similarly to the case of FIG. 11A. Note that, in FIGS. 11A to 11C, the same components as those of the printed wiring board 100 according to the first embodiment are denoted by the same reference symbols. The printed circuit board 500 according to the first embodiment is different from the printed circuit board of the reference example illustrated in FIGS. 11A to 11C in that the pad 141 is formed.

In the case of the wiring structure illustrated in FIGS. 11A to 11C, large crosstalk noise is caused between the wiring paths 137 and 138 extending in the direction orthogonal to the surface of the printed wiring board.

In the structure illustrated in FIGS. 11A to 11C, when current as an electric signal passes through the first wiring path 137 extending in the direction orthogonal to the surface of the printed wiring board, an electromotive force, that is, so-called crosstalk noise is caused in the second wiring path 138 which is coupled to the first wiring path 137 in terms of an electromagnetic field and which extends in an out-of-plane direction.

Crosstalk noise can be broken into a noise component caused under the influence of an electric field generated by capacitive coupling between signal wirings, and a noise component caused under the influence of a magnetic field generated by inductive coupling between signal wirings.

When a rising step pulse signal passes through a signal wiring, crosstalk noise caused in an adjacent signal wiring under the influence of the electric field appears as a pulse having a positive amplitude. On the other hand, crosstalk noise caused in an adjacent signal wiring under the influence of the magnetic field appears as a pulse having a negative amplitude. Actually, the phenomenon that crosstalk noise is caused by the electric field and the phenomenon that crosstalk noise is caused by the magnetic field occur at the same time. Therefore, the resulting crosstalk noise has an amplitude which is the sum of the positive amplitude caused under the influence of the electric field and the negative amplitude caused under the influence of the magnetic field, that is, the result of cancellation between the influence of the electric field and the influence of the magnetic field.

The magnitude of crosstalk noise having a negative amplitude which is caused under the influence of a magnetic field is proportional to the magnitude of the inductive coupling between the signal wirings. The magnitude of the inductive coupling is correlated with the relative permeability around the signal wirings. The magnitude of crosstalk noise having a positive amplitude which is caused under the influence of an electric field is proportional to the magnitude of the capacitive coupling between the signal wirings. The magnitude of the capacitive coupling is correlated with the relative permittivity around the signal wirings.

The signal wiring patterns 111 to 114 formed on the surfaces of the printed wiring board have a microstrip structure or a strip line structure formed on the printed wiring board 100. In this case, the relative permeability around the signal wiring patterns 111 to 114 is 1.0. The relative permittivity of a glass epoxy board which is generally used as a printed wiring board mounted on electronic equipment is 4.1 to 4.8 (median: 4.3). On the other hand, with regard to the first and second wiring paths 137 and 138 extending in an out-of-plane direction, the solder balls 551 and 552 are surrounded by air, and thus, both the relative permeability and the relative permittivity are 1.0.

As described above, the most distinguishing feature of the solder balls 551 and 552 in the first and second wiring paths 137 and 138 from the signal wiring patterns 111 to 114 is that the relative permittivity of the surroundings is low and the capacitive coupling between the signal wirings is small. It is found that, because of such a structure, crosstalk noise caused under the influence of the electric field is small, and thus, crosstalk noise caused under the influence of the magnetic field is not cancelled out, and, as a whole, crosstalk noise having a large amplitude is caused mainly under the influence of the magnetic field.

For example, when comparisons are made with regard to a unit length, crosstalk noise caused in the first and second wiring paths 137 and 138 is about ten times as large as crosstalk noise caused in the signal wiring patterns 111 to 114 formed on the surfaces of the printed wiring board. It is found that, when the length of the first and second wiring paths 137 and 138 each including a solder ball and a via is 2 mm, crosstalk noise caused therein is equivalent to crosstalk noise caused in about 20 to 30 mm of signal wiring formed on a surface of the printed wiring board.

Therefore, according to the first embodiment, as illustrated in FIGS. 2A to 2C, the pad 141 electrically connected to the first via 131 is provided in the third conductor layer 103. The pad 141 is formed into a shape of a disc. As illustrated in FIG. 2A, the pad 141 includes an opposed portion 141a which overlaps a part (opposed portion) 122a of the second electrode pad 122 as viewed in a direction perpendicular to the board surface 100a and which is opposed no the part 122a of the second electrode pad 122 through the intermediation of the insulator 105.

The opposed portion 141a of the pad 141 and the opposed portion 122a of the second electrode pad 122 are opposed to each other through the intermediation of the insulator 105, and thus, the capacitive coupling caused between the signal wirings 135 and 136 which are adjacent to each other can be increased. More specifically, the capacitive coupling between the opposed portions 122a and 141a is added to the capacitive coupling between the solder balls 551 and 552, and thus, the capacitive coupling can be increased.

The noise component due to the capacitive coupling has an amplitude which is opposite to the amplitude of the noise component due to the inductive coupling, and thus, the two noise components are cancelled out, and, as a result, crosstalk noise as a whole is reduced.

Further, the insulator 105 has a relative permittivity which is larger than that of air that fills the space between the solder balls 551 and 552. Therefore, the noise component caused between the opposed portion 141a of the pad 141 and the opposed portion 122a of the second electrode pad 122 due to the capacitive coupling can be more effectively increased.

Figure 3:
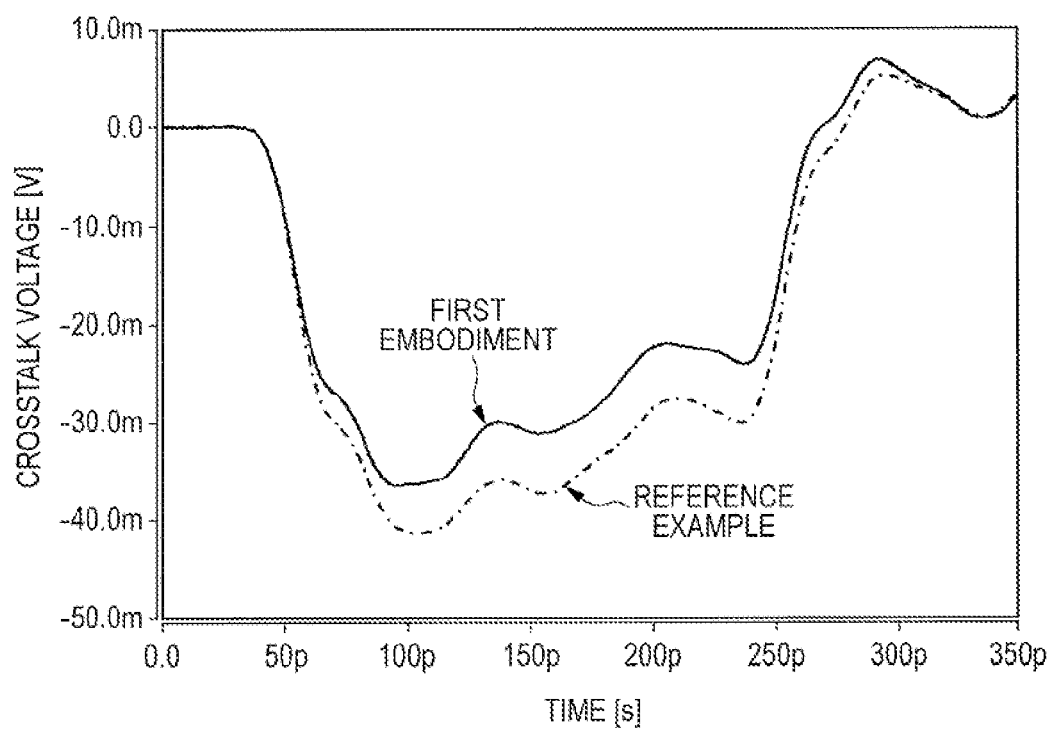
FIG. 3 is a graph snowing the voltage of crosstalk noise caused in the printed circuit board according to the first embodiment.

FIG. 3 is a graph snowing the voltage of crosstalk noise caused in the printed circuit board according to the first embodiment. For comparison purposes, the voltage of crosstalk noise caused in the printed circuit board of the reference example illustrated in FIGS. 11A to 11C is also shown. In FIG. 3, a solid line indicates crosstalk noise in the printed circuit board 500 according to the first embodiment, while a dot-and-dash line indicates crosstalk noise in the printed circuit board of the reference example. In the printed circuit board of the reference example, crosstalk noise having an amplitude of −40 mV (peak value) is caused, while in the printed circuit board 500 according to the first embodiment, the amplitude of the crosstalk noise is reduced to −35 mV (peak value).

As described above, the capacitive coupling is affected by the relative permittivity of the insulating material of the insulator 105 (for example, a composite material prepared by impregnating glass cloth with an epoxy resin). It is known that the relative permittivity of the composite material is 4.1 to 4.8 (median: 4.3). This capacitive coupling in the vicinity of the insulator can be added to the capacitive coupling between the solder balls 551 and 552, thereby increasing the noise component caused under the influence of the electric field and cancelling out the noise component caused under the influence of the electric field and the noise component caused under the influence of the magnetic field. As a result, the resulting crosstalk noise caused between the signal wirings 135 and 136 can be reduced.

Figure 4A:
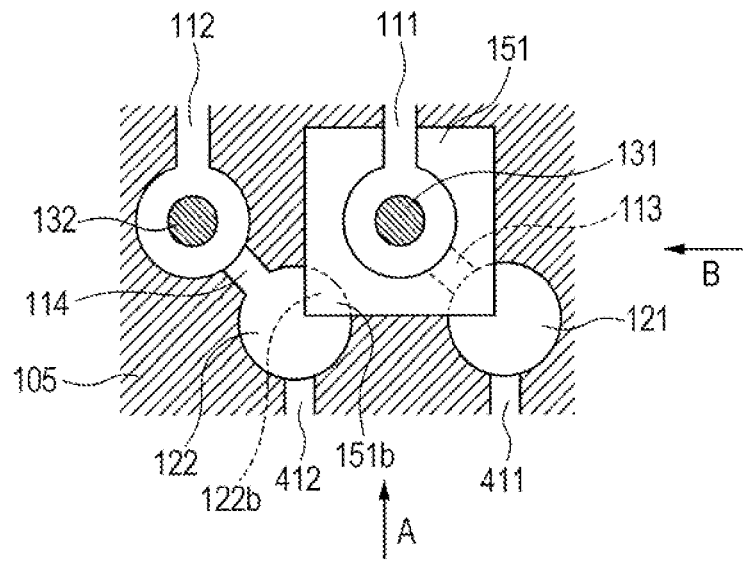
FIGS. 4A, 4B and 4C are detail views illustrating a part of another printed circuit board according to the first embodiment.
Figure 4B:
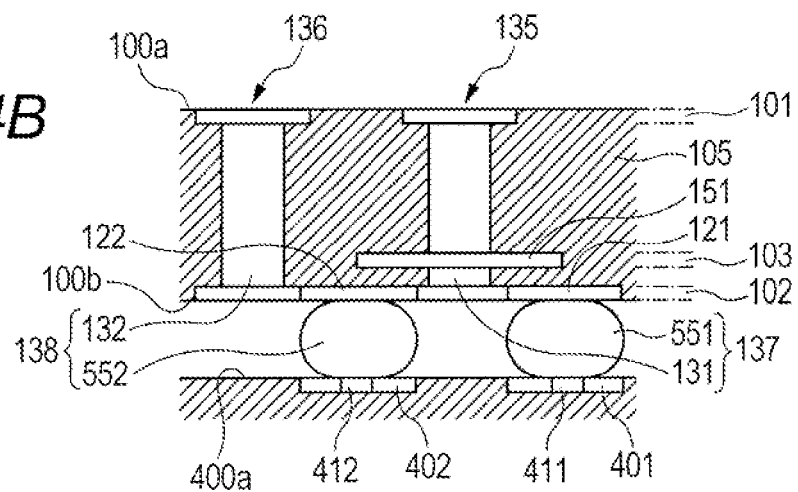
Figure 4C:
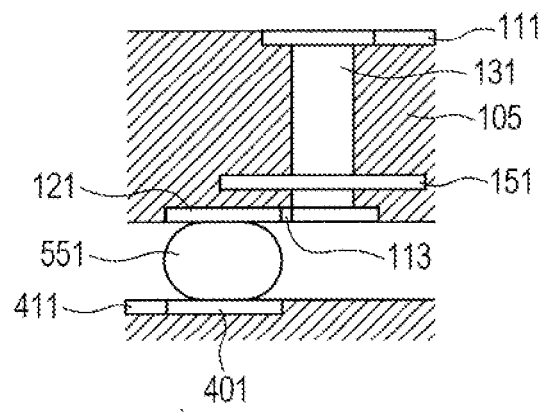

Note that, in the first embodiment, a case in which the pad (first pad) 141 has the shape of a disc is described, but the present invention is not limited thereto, and the pad 141 may have any shape insofar as the pad 141 includes an opposed portion which overlaps the second electrode pad 122. FIGS. 4A to 4C illustrate another printed circuit board according to the first embodiment. FIG. 4A is a top view of a part of the printed circuit board as viewed from above. For the sake of easy understanding, the printed wiring board is transparently illustrated. FIG. 4B is a side view of the part of the printed circuit board illustrated in FIG. 4A as viewed in the direction of the arrow A. FIG. 4C is a side view of the part of the printed circuit board illustrated in FIG. 4A as viewed in the direction of the arrow 5. In both FIGS. 4B and 4C, the printed wiring board is transparently illustrated similarly to the case of FIG. 4A. In FIGS. 4A to 4C, a plate-like pad 151 having a plane formed, into a shape of a quadrangle is formed in the third conductor layer 103. The pad 151 includes an opposed portion 151b which is opposed to a part (opposed portion) 122b of the second electrode pad 122. This also enables reduction of the crosstalk noise by the noise component due to the capacitive coupling which cancels out the noise component due to the inductive coupling. Specifically, the shape of the pad is not limited to a plate-like circle or quadrangle and the pad may have any shape insofar as the pad includes a portion opposed to the second electrode pad 122 through the intermediation of the insulator 105.

Second Embodiment

Figure 5A:
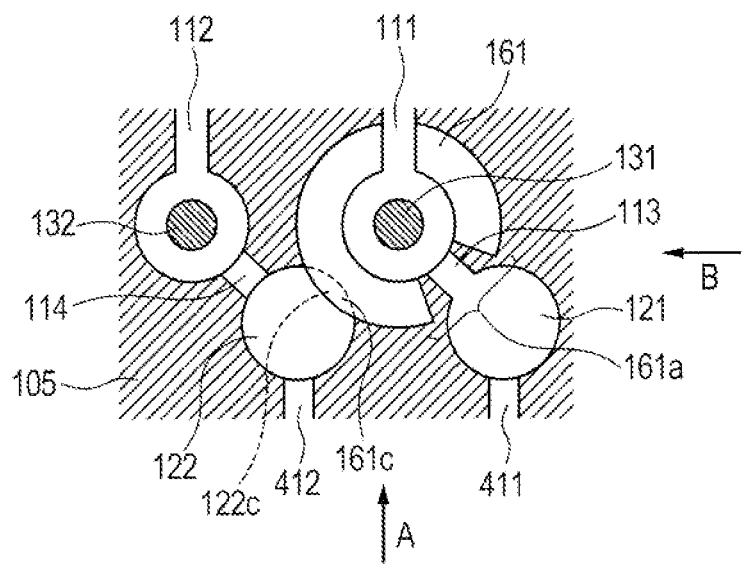
FIGS. 5A, 5B and 5C are detail views illustrating a part of a printed circuit board according to a second embodiment of the present invention.
Figure 5B:
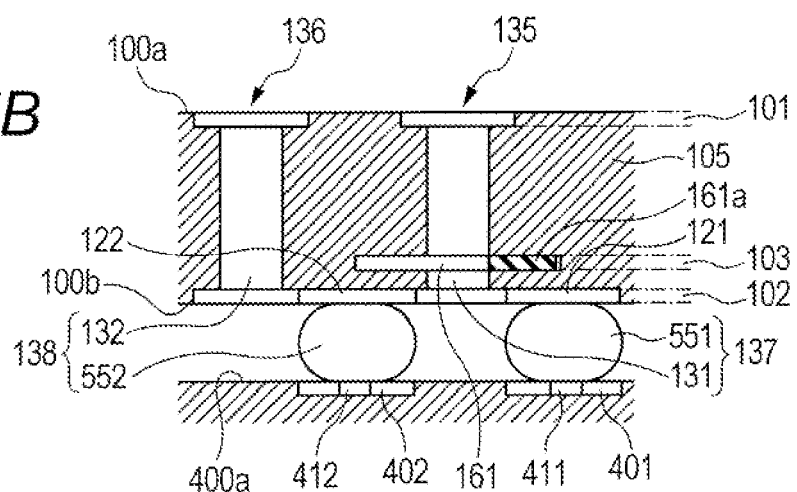
Figure 5C:
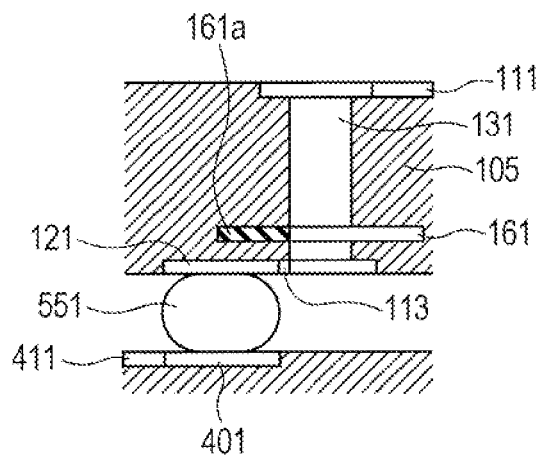

Next, a printed circuit board according to a second embodiment of the present invention is described. FIGS. 5A to 5C are detail views illustrating a part of the printed circuit board according to the second embodiment of the present invention. FIG. 5A is a top view of the part of the printed circuit board as viewed from above. For the sake of easy understanding, the printed wiring board is transparently illustrated. FIG. 5B is a side view of the part of the printed circuit board illustrated in FIG. 5A as viewed in the direction of an arrow A. FIG. 5C is a side view of the part of the printed circuit board illustrated in FIG. 5A as viewed in the direction of an arrow B. In both FIGS. 5B and 5C, the printed wiring board is transparently illustrated similarly to the case of FIG. 5A. Note that, in FIGS. 5A to 5C, the same components as those of the printed wiring board 100 according to the above-mentioned first embodiment are denoted by the same reference symbols, and detailed description thereof is omitted.

In the second embodiment, as illustrated in FIG. 5B, instead of the pad 141 (151) of the above-mentioned, first embodiment, a pad (first pad) 161 electrically connected, to the first via is formed in the third conductor layer 103. In the second embodiment, similarly to the case of the above-mentioned first embodiment, an opposed portion 161c of the pad 161 and an opposed portion 122c of the second electrode pad 122 are opposed to each other through the intermediation of the insulator 105. This enables, similarly to the case of the above-mentioned first embodiment, increase of the capacitive coupling caused between the signal wirings 135 and 136 which are adjacent to each other. The noise component due to the capacitive coupling has an amplitude which is opposite to the amplitude of the noise component due to the inductive coupling, and thus, the two noise components are cancelled out, and, as a result, the crosstalk noise as a whole is reduced.

Further, the insulator 105 has a relative permittivity which is larger than that of air that fills the space between the solder balls 551 and 552. Therefore, the capacitive coupling caused between the opposed portion 161c of the pad 161 and the opposed portion 122c of the second electrode pad 122 can be more effectively increased.

As illustrated in FIG. 5A, the pad 161 is formed into a shape which is not opposed to the first electrode pad 121 as viewed in the direction perpendicular to the board surface 100a (or the board surface 100b). Description is made in further detail in the following. As illustrated in FIG. 5A, the pad 161 is formed into a shape which is not opposed to the third signal wiring pattern 113 as viewed in the direction perpendicular to the board surface 100a (or the board surface 100b). In the second embodiment, a notch 161a is formed in the pad 161 at a portion which is opposed to the first electrode pad 121 and the third signal wiring pattern 113.

The magnitude of crosstalk noise caused under the influence of an electric field between signal wirings is proportional to Cm/Cs, where Cm is the capacitance of the capacitive coupling per unit length between the signal wirings and Cs is the capacitance per unit length of the signal wirings themselves.

Capacitive coupling between the opposed portion 161c of the pad 161 and the opposed portion 122c of the second electrode pad 122 of the adjacent wiring increases the capacitance Cs. On the other hand, in the pad 161, the notch 161a is formed in a region in which the pad 161 is opposed to both the first electrode pad 121 and the third signal wiring pattern 113 which are electrically connected to the pad 161, and thus, the capacitance Cs of the signal wirings themselves is reduced.

Therefore, the provision of the notch 161a causes the denominator of Cm/Cs to be smaller as compared, with a case without the notch 161a, which further increases the crosstalk noise caused under the influence of the electric field. Therefore, the crosstalk noise caused under the influence of the magnetic field can be further cancelled out, and the influence of the resulting crosstalk noise can be further reduced.

Figure 6:
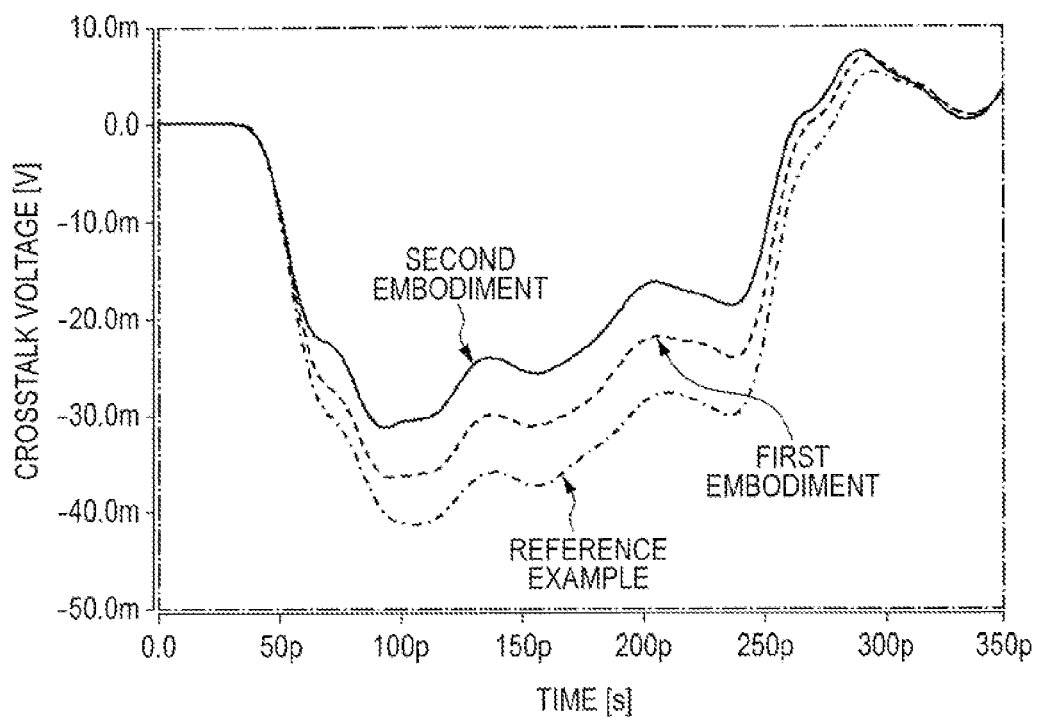
FIG. 6 is a graph showing the voltage of crosstalk noise caused in the printed circuit board according to the second embodiment.

FIG. 6 is a graph showing the voltage of crosstalk noise caused in the printed circuit board according to the second embodiment of the present invention. For comparison purposes, the voltage of crosstalk noise caused in the printed circuit board of the reference example illustrated in FIGS. 11A to 11C is also shown. Further, the voltage of crosstalk noise caused in the printed circuit board according to the above-mentioned first embodiment without the notch 161a is also shown.

In the printed circuit board of the reference example, crosstalk noise having an amplitude of −40 mV (peak value) is caused. In the printed circuit board according to the above-mentioned first embodiment, the amplitude of the crosstalk noise can be reduced to −35 mV (peak value). According to the structure of the printed circuit board of the second embodiment, the amplitude of the crosstalk noise can be further reduced to −30 mV (peak value).

Note that, in the second embodiment, a case in which the pad (first pad) 161 has the notch 161a formed therein is described, but the present invention is not limited thereto. The pad may have any shape insofar as the pad and the first electrode pad are not opposed to each other and the pad and the second electrode pad are opposed to each other as viewed in the direction perpendicular to the board surface 100a.

Figure 7A:
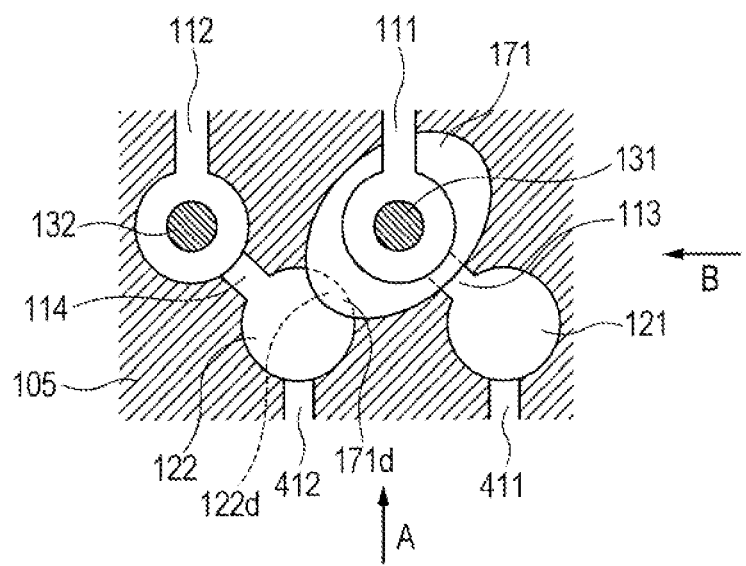
FIGS. 7A, 7B and 7C are detail views illustrating a part of another printed circuit board according to the second embodiment.
Figure 7B:
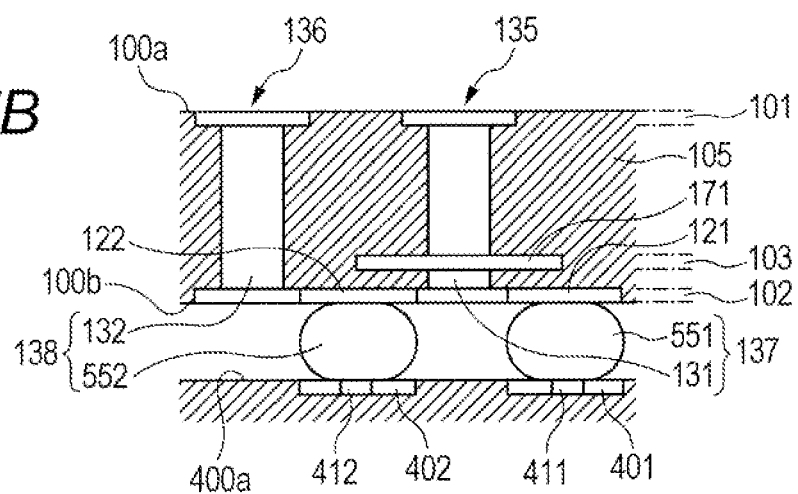
Figure 7C:
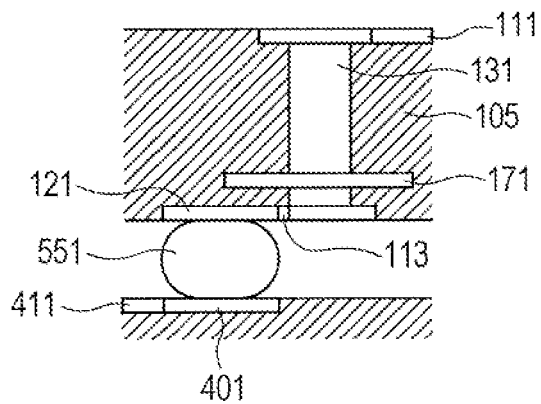

FIGS. 7A to 7C illustrate another printed circuit board according to the second embodiment. FIG. 7A is a top view of a part of the printed circuit board as viewed from above. For the sake of easy understanding, the printed wiring board is transparently illustrated. FIG. 7B is a side view of the part of the printed circuit board illustrated in FIG. 7A as viewed in the direction of the arrow A. FIG. 7C is a side view of the part of the printed circuit board illustrated in FIG. 7A as viewed in the direction of the arrow B. In both FIGS. 7B and 7C, the printed wiring board is transparently illustrated similarly to the case of FIG. 7A. In FIGS. 7A to 7C, a plate-like pad 171 having a plane formed into a shape of an ellipse is formed in the third conductor layer 103. The major axis of the ellipse of the pad 171 extends toward the second electrode pad 122 for an adjacent signal. In this way, the pad 171 includes an opposed portion 171d which is opposed to a part (opposed portion) 122d of the second electrode pad 122. This also enables reduction of the crosstalk noise by the noise component due to the capacitive coupling which cancels out the noise component due to the inductive coupling.

Further, the minor axis of the ellipse of the pad 171 extends toward the first electrode pad 121 for its own signal, and the pad 171 is formed into a shape which is not opposed to the first electrode pad 121. The pad 111 having the shape of an ellipse can also reduce the capacitance Cs, and a similar effect can be obtained. Further, when, for example, the first electrode pad has the shape of an ellipse, the pad may have a shape of a disc. The pad and the first electrode pad may have any shape insofar as the pad and the first electrode pad are not opposed to each other and the pad and the second electrode pad are opposed to each other. Further, it is more preferred that the pad be formed into a shape which is not opposed to the third signal wiring pattern as viewed in the direction perpendicular to the board surface 100a.

Third Embodiment

Figure 8A:
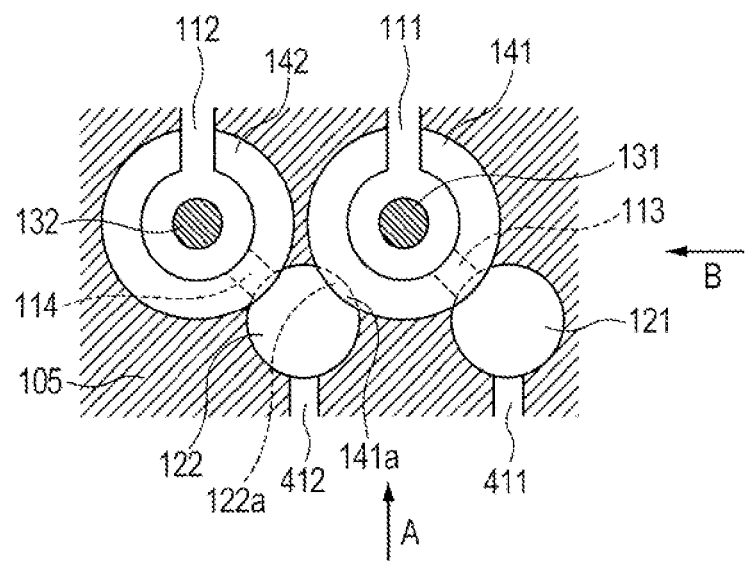
FIGS. 8A, 8B and 8C are detail views illustrating a part of a printed circuit board according to a third embodiment of the present invention.
Figure 8B:
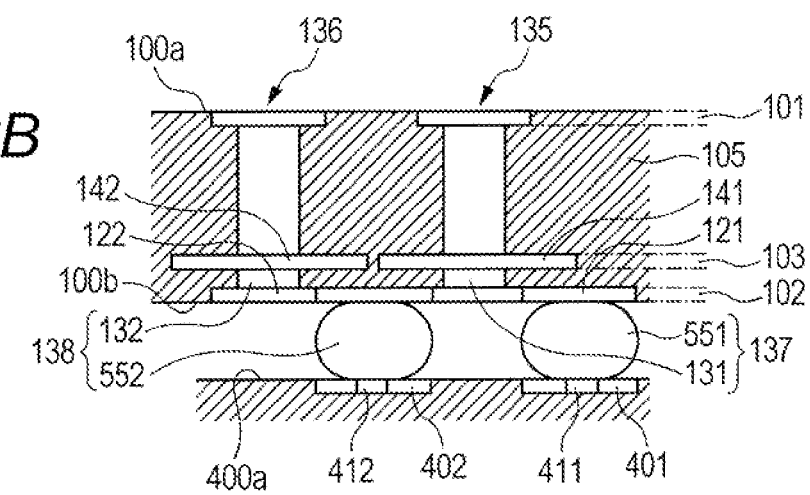
Figure 8C:
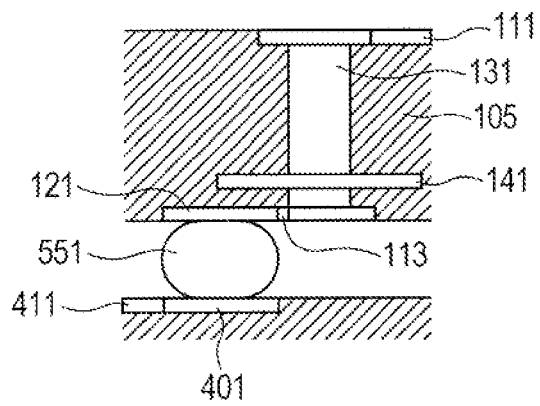

Next, a printed circuit board according to a third embodiment of the present invention is described. FIGS. 8A to 8C are detail views illustrating a part of the printed circuit board according to the third embodiment of the present invention. FIG. 8A is a top view of the part of the printed circuit board as viewed from above. For the sake of easy understanding, the printed wiring board is transparently illustrated. FIG. 8B is a side view of the part of the printed circuit board illustrated in FIG. 8A as viewed in the direction of an arrow A. FIG. 8C is a side view of the part of the printed circuit board illustrated in FIG. 8A as viewed in the direction of an arrow B. In both FIGS. 8B and 8C, the printed wiring board is transparently illustrated similarly to the case of FIG. 8A. Note that, in FIGS. 8A to 8C, the same components as those of the printed wiring board 100 according to the above-mentioned first embodiment are denoted by the same reference symbols, and detailed description thereof is omitted.

The printed circuit board according to the third embodiment further includes, in addition to the structure of the above-mentioned first embodiment, a second pad 142 formed in the third conductor layer 103 and electrically connected to the second via 132. The second pad 142 is formed in the same layer as the first pad 141. The second pad 142 is disposed adjacent to the first pad 141 with space therebetween. End surfaces of the pads 141 and 142 are opposed to each other with the insulator 105 therebetween.

Note that, in the third embodiment, similarly to the case of the above-mentioned first embodiment, the first pad 141 and the second electrode pad 122 have the opposed portions 141a and 122a, respectively, which are opposed to each other as viewed in the direction perpendicular to the board surface 100a.

The above-mentioned structure can, similarly to the case of the above-mentioned first embodiment, cause capacitive coupling between the opposed portions 141a and 152a. Further, according to the third embodiment, capacitive coupling can be further caused between the first pad 141 and the second pad 142 which are formed in the same inner layer. Therefore, according to the third embodiment, the noise component due to the inductive coupling can be further effectively cancelled out by the noise component due to the capacitive coupling, and thus, the crosstalk noise can be reduced further effectively.

Figure 9:
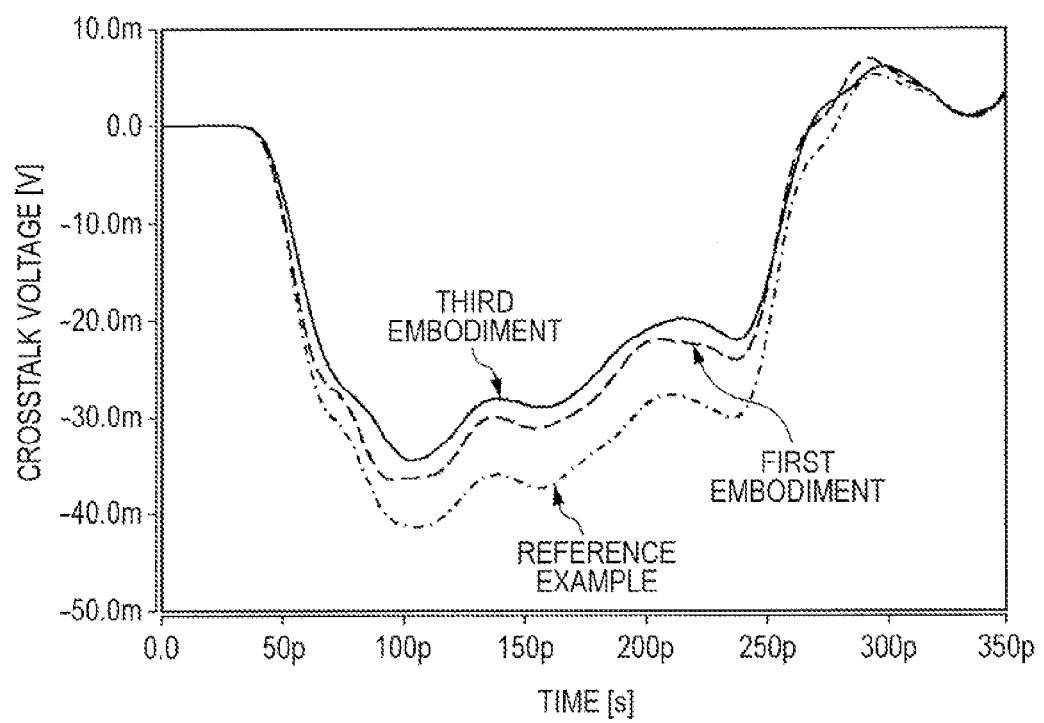
FIG. 9 is a graph showing the voltage of crosstalk noise caused in the printed circuit board according to the third embodiment.

FIG. 9 is a graph showing the voltage of crosstalk noise caused in the printed circuit board according to the third embodiment of the present invention. For comparison purposes, the voltage of crosstalk noise caused in the printed circuit board of the reference example illustrated in FIGS. 11A to 11C is also shown. Further, the voltage of crosstalk noise caused in the printed circuit board according to the above-mentioned first embodiment is also shown.

In the printed circuit board of the reference example, crosstalk noise having an amplitude of −40 mV (peak value) is caused. In the printed circuit board according to the above-mentioned first embodiment, the amplitude of the crosstalk noise can be reduced to −35 mV (peak value). According to the structure of the printed circuit board of the third embodiment, the amplitude of the crosstalk noise can be further reduced to −32 mV (peak value).

Fourth Embodiment

Figure 10A:
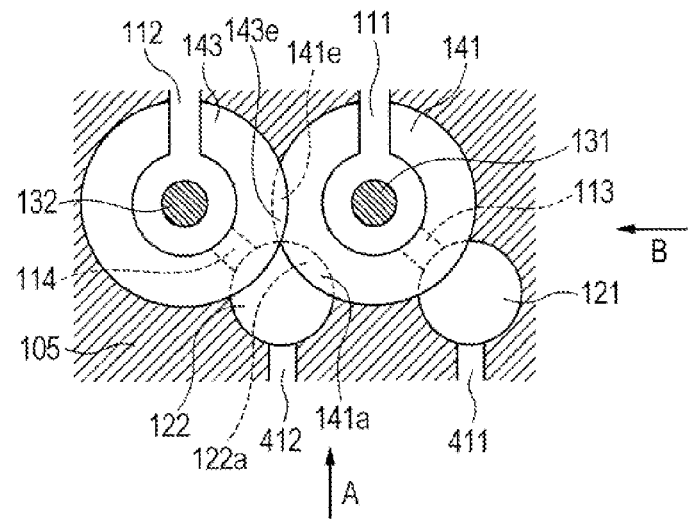
FIGS. 10A, 10E and 10C are detail views illustrating a part of a printed circuit board according to a fourth embodiment of the present invention.
Figure 10B:
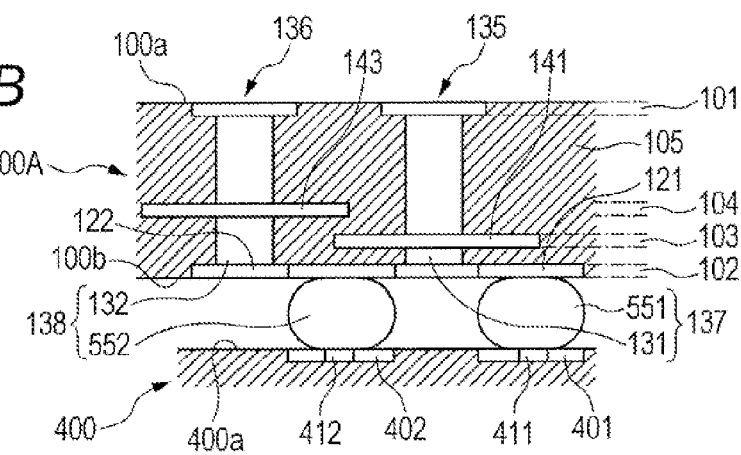
Figure 10C:
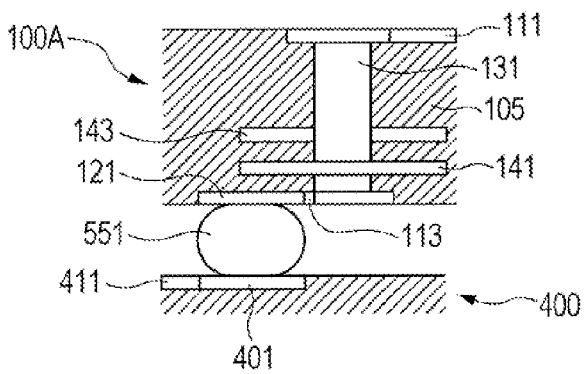

Next, a printed circuit board according to a fourth embodiment of the present invention is described. FIGS. 10A to 10C are detail views illustrating a part of the printed circuit board according to the fourth embodiment of the present invention. FIG. 10A is a top view of the part of the printed circuit board as viewed from above. For the sake of easy understanding, the printed wiring board is transparently illustrated. FIG. 10E is a side view of the part of the printed circuit board illustrated in FIG. 10A as viewed in the direction of an arrow A. FIG. 10C is a side view of the part of the printed circuit board illustrated in FIG. 10A as viewed in the direction of an arrow B. In both FIGS. 10B and 10C, the printed wiring board is transparently illustrated similarly to the case of FIG. 10A. Note that, in FIGS. 10A to 10C, the same components as those of the printed wiring board 100 according to the above-mentioned first embodiment are denoted by the same reference symbols, and detailed, description thereof is omitted.

The printed circuit board according to the fourth embodiment further includes, in addition to the structure of the above-mentioned first embodiment, a fourth conductor layer 104 formed between the first conductor layer 101 and the third conductor layer 103 through the intermediation of the insulator 105 in a printed wiring board 100A of the semiconductor package. A second pad 143 electrically connected to the second via 132 is formed in the fourth conductor layer 104.

The second pad 143 includes an opposed portion 143e which overlaps a part (opposed portion) 141e of the first pad 141 as viewed in the direction perpendicular to the board surface 100a and which is opposed to the part 141e of the first pad 141 through the intermediation of the insulator 105. In other words, the opposed portion 141e of the first pad 141 and the opposed portion 143e of the second pad 143 are opposed to each other with the insulator 105 therebetween.

Note that, in the fourth embodiment, similarly to the case of the above-mentioned first embodiment, the first pad 141 and the second electrode pad 122 have the opposed portions 141a and 122a, respectively, which are opposed to each other as viewed in the direction perpendicular to the board surface 100a.

The above-mentioned structure can, similarly to the case of the above-mentioned first embodiment, cause capacitive coupling between the opposed portions 141a and 122a. Further, according to the fourth embodiment, capacitive coupling can be further caused between the first pad 141 and the second pad 143 which are formed in inner layers different from each other. Therefore, according to the fourth embodiment, the noise component due to the inductive coupling can be further effectively cancelled out by the noise component due to the capacitive coupling, and thus, the crosstalk noise can be reduced further effectively. In particular, a surface of the first pad 141 and a surface of the second pad 143 are opposed to each other, and thus, the capacitance between the pads 141 and 143 can be increased. Thus, the crosstalk noise can be reduced more effectively.

Note that, the present invention is not limited to the embodiments described above, and various modifications can be made by those with an ordinary skill in the art within the technical idea of the present invention.

In the first to fourth embodiments described above, a case in which connection terminals for mounting the semiconductor package on the main board are connected to the semiconductor package is described, but the present invention can also be applied to a case in which the semiconductor package includes connection terminals for mounting the semiconductor package on the main board.

Further, in the case of a EGA package, multiple second electrode pads are arranged around the first electrode pad. The first pad and each of the multiple second pads may be opposed to each other so that the first pad overlaps each of the multiple second electrode pads. This enables reduction of the crosstalk noise among multiple signal wirings.

Further, in the first to fourth embodiments described above, description is made with regard to the pads connected to the main board through the connection terminals in the printed wiring board of the semiconductor package, but the present invention is not limited thereto. The present invention can also be applied to printed wiring boards vertically adjacent to each other in a multilayer semiconductor package formed by stacking the multiple printed wiring boards.

Further, in the first to fourth embodiments described above, a case in which the first conductor layer is a surface layer is described, but the first conductor layer may be an inner layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-097572, filed Apr. 23, 2012, which is hereby incorporated by reference herein, in its entirety.

What is claimed is:

1. A printed wiring board having a plurality of conductor layers, the printed wiring board comprising:
a first conductor layer having a first signal wiring pattern and a second signal wiring pattern formed therein;
a second conductor layer which is formed on a second surface of the printed wiring board and which has a first external electrode pad and a second external electrode pad formed therein, the first external electrode pad being electrically connected to the first signal wiring pattern through a first via, the second external electrode pad being electrically connected to the second signal wiring pattern through a second via; and
a third conductor layer disposed between the first conductor layer and the second conductor layer through intermediation of an insulator, the third conductor layer having a first pad formed therein, the first pad being electrically connected to the first via,
wherein the first external electrode pad is connectable to a first terminal and the second external electrode pad is connectable to a second terminal, and
wherein the first pad comprises an opposed portion which overlaps the second external electrode pad at a second opposed portion of the second external electrode pad as viewed in a direction perpendicular to a surface of the printed wiring board and which is opposed to the second external electrode pad through intermediation of the insulator such that capacitive coupling between the first and second opposed portions is provided.

2. The printed wiring board according to claim 1, wherein the first pad is a conductor that surrounds the first via, and a width of the first pad is larger than wiring widths of the first and the second signal wiring patterns.

3. The printed wiring board according to claim 1, wherein the second conductor layer comprises a third signal wiring pattern formed therein, the third signal wiring pattern electrically connecting the first via and the first external electrode pad to each other, and wherein the first pad is prevented from being opposed to the first external electrode pad as viewed in the direction perpendicular to the surface of the printed wiring board.

4. The printed wiring board according to claim 1, wherein the second conductor layer comprises a third signal wiring pattern formed therein, the third signal wiring pattern electrically connecting the first via and the first external electrode pad to each other, and wherein the first pad is formed into a shape without being opposed to the third signal wiring pattern as viewed in the direction perpendicular to the surface of the printed wiring board.

5. The printed wiring board according to claim 1, wherein the third conductor layer comprises a second pad formed therein, the second pad being electrically connected to the second via and spaced from the first pad.

6. The printed wiring board according to claim 1, further comprising a fourth conductor layer disposed between the first conductor layer and the third conductor layer through intermediation of the insulator, the fourth conductor layer having a second pad formed therein, the second pad being electrically connected to the second via, wherein the second pad comprises an opposed portion which overlaps the first pad as viewed in the direction perpendicular to the surface of the printed wiring board and which is opposed to the first pad through intermediation of the insulator.

7. A semiconductor package, comprising:
a semiconductor element; and
an interposer substrate having the semiconductor element mounted on a first surface thereof and having a plurality of conductor layers, the interposer substrate comprising:
a first conductor layer having a first signal wiring pattern and a second signal wiring pattern formed therein;
a second conductor layer which is formed on a second surface opposed to the first surface of the printed wiring board and which has a first external electrode pad and a second external electrode pad formed therein, the first external electrode pad being electrically connected to the first signal wiring pattern through a first via, the second external electrode pad being electrically connected to the second signal wiring pattern through a second via;
a third conductor layer disposed between the first conductor layer and the second conductor layer through intermediation of an insulator, the third conductor layer having a first pad formed therein, the first pad being electrically connected to the first via;
a first external electrode provided on the first external electrode pad; and
a second external electrode provided on the second external electrode pad,
wherein the first external electrode pad is connectable to a first terminal and the second external electrode pad is connectable to a second terminal, and
wherein the first pad comprises an opposed portion which overlaps the second external electrode pad at a second opposed portion of the second external electrode pad as viewed in a direction perpendicular to a surface of the printed wiring board and which is opposed to the second external electrode pad through intermediation of the insulator such that capacitive coupling between the first and second opposed portions is provided.

8. The semiconductor package according to claim 7, wherein the first pad is a conductor that surrounds the first via, and a width of the first pad is larger than wiring widths of the first and the second signal wiring patterns.

9. The semiconductor package according to claim 7, wherein the second conductor layer comprises a third signal wiring pattern formed therein, the third signal wiring pattern electrically connecting the first via and the first external electrode pad to each other, and wherein the first pad is prevented from being opposed to the first external electrode pad as viewed in the direction perpendicular to the surface of the printed wiring board.

10. The semiconductor package according to claim 7, wherein the second conductor layer comprises a third signal wiring pattern formed therein, the third signal wiring pattern electrically connecting the first via and the first external electrode pad to each other, and wherein the first pad is formed into a shape without being opposed to the third signal wiring pattern as viewed in the direction perpendicular to the surface of the printed wiring board.

11. The semiconductor package according to claim 7, wherein the third conductor layer comprises a second pad formed therein, the second pad being electrically connected to the second via and spaced from the first pad.

12. The semiconductor package according to claim 7, further comprising a fourth conductor layer disposed between the first conductor layer and the third conductor layer through intermediation of the insulator, the fourth conductor layer having a second pad formed therein, the second pad being electrically connected to the second via, wherein the second pad comprises an opposed portion which overlaps the first pad as viewed in the direction perpendicular to the surface of the printed wiring board and which is opposed to the first pad through intermediation of the insulator.

13. A printed circuit board, comprising:
the semiconductor package according to claim 7; and
a main board having the semiconductor package mounted thereon,
wherein a first main board side pad provided on the main substrate is connected to the first electrode pad through the first external electrode, and a second main board side pad provided on the main substrate is connected to the second electrode pad through the second external electrode.

* * * * *